310-369 SR

XR 3,609,417

United States Patent

[11] 3,609,417

[72] Inventors Yuichi Kaname;
Kingo Wada, both of Osaka-fu, Japan

[21] Appl. No. 4,201
[22] Filed Jan. 20, 1970
[45] Patented Sept. 28, 1971

[73] Assignee Mitsushita Electric Industrial Co., Ltd.
Kadoma, Osaka, Japan

[54] PIEZOELECTRIC CERAMIC RING RESONATOR
1 Claim, 5 Drawing Figs.

[52] U.S. Cl. 310/9.5, 310/8.9, 310/9.4, 310/9.6
[51] Int. Cl. H01v 7/00
[50] Field of Search 310/9.5, 9.6, 9.1, 9.4, 9.7, 8.9; 333/72

[56] References Cited

UNITED STATES PATENTS

| | | | |
|---|---|---|---|
| 1,907,425 | 5/1933 | Marrison | 310/9.6 X |
| 1,907,426 | 5/1933 | Marrison | 310/9.6 |
| 2,177,629 | 10/1939 | Foster | 310/9.1 X |
| 2,513,147 | 6/1950 | Chorpening | 310/9.1 X |
| 2,906,971 | 9/1959 | Mason et al. | 333/72 X |
| 2,988,728 | 6/1961 | Marlow | 310/9.5 X |
| 3,019,660 | 2/1962 | Welkowitz | 310/8 X |
| 3,069,573 | 12/1962 | Liew | 310/9.4 X |

*Primary Examiner*—David X. Sliney
*Assistant Examiner*—Mark O. Budd
*Attorney*—Wenderoth, Lind & Ponack

ABSTRACT: A piezoelectric ceramic resonator adapted for an IF filter comprises a piezoelectric ceramic thin ring having two electrodes applied to opposed major surfaces, and two conductive plates secured to each electrode, each of the conductive plates consisting essentially of a lead stem and a conductive ring similar in the size and shape to the piezoelectric ceramic ring. The ceramic ring is a fundamental resonant frequency of radial vibration mode.

INVENTORS
YUICHI KANAME
KINGO WADA

BY Wenderoth, Lind & Ponack
ATTORNEYS

INVENTORS
YUICHI KANAME
KINGO WADA

BY Wenderoth, Lind & Ponack
ATTORNEYS

PIEZOELECTRIC CERAMIC RING RESONATOR

BACKGROUND OF THE INVENTION

This invention relates to piezoelectric ceramic ring resonators, and more particularly to an improved structure and mounting for resonators of piezoelectric ceramic filters.

Piezoelectric ceramic ring resonators have been known in the art, and are principally used for ultrasonic transducers and electromechanical transducers of vibration pickup. These prior art piezoelectric ceramic ring resonators have relatively large dimensions and are relatively thick rings having two electrodes applied to opposed major surfaces. Lead wires or lead terminals can be easily applied to the electrodes of these piezoelectric ceramic ring resonators without causing variations of electromechanical properties and vibration characteristics thereof. On the other hand, the piezoelectric ceramic ring resonators for piezoelectric ceramic wave filter applications, in particular, 455kHz. IF filters for radio receivers, are small, and are thus affected by lead wires or lead terminals with respect to electromechanical properties.

Therefore, a small piezoelectric ceramic ring resonator is apt to produce unwanted responses, and the resonant vibrations thereof are susceptible to damping. Such resonators are thus not suitable for use as piezoelectric ceramic wave filters.

Therefore, a principal object of the present invention is to provide an improved piezoelectric ceramic resonator which overcomes one or more of the disadvantages.

A further object of the present invention is to provide a novel piezoelectric ceramic resonator which reduces unwanted responses in a required frequency range.

A further object of the present invention is to provide a mounting structure suitable for a piezoelectric ceramic ring resonator of radial mode of vibration.

A further object of the present invention is to provide an improved piezoelectric ceramic ring resonator which is characterized by a suitable band width of an IF ceramic filter of a radio receiver.

A further object of the present invention is to provide an improved piezoelectric ceramic filter element which is small in size.

Other objects of the present invention will become apparent from the following detailed description taken in connection with the accompanying drawings.

BRIEF DESCRIPTION OF THE DRAWINGS

Referring to FIG. 1, reference numeral 10 designates, as a whole, a piezoelectric ceramic ring resonator which comprises a piezoelectric ceramic thin ring 12 having two electrodes 13 and 14 applied to opposed major surfaces of ring 12. Two conductive plates 20 and 20' are secured to the electrodes 13 and 14 adhesive layers 15 and 16, respectively. Each of the conductive plates 20 and 20' consists essentially of a lead stem 21 and 21', and a conductive ring 22 and 22', which is substantially similar in size and shape to the piezoelectric ceramic ring 12. The electrodes 13 and 14 wholly cover the opposed major surfaces of the piezoelectric ceramic thin ring 12. The conductive ring 22 is firmly secured to electrode 13 by any suitable method, for example, by epoxy adhesive, or solder. The other conductive ring 22' is similarly secured to the electrode 14. The lead stems 21 and 21' are not opposed to each other, as shown in FIG. 1. The piezoelectric ceramic ring 12 is polarized in the direction of its thickness.

Referring to FIG. 2, the horizontal axis shows frequency in kHz. while the vertical axis shows relative values of electric admittance in db. The solid curve shows the electric admittance of the piezoelectric ceramic thin ring resonator 10 of the present invention as shown in FIG. 1. The dotted curve shows the electric admittance of the ceramic thin ring 12 when supported by a soldered lead wire attached to electrodes 13 and 14. The ceramic thin ring 12 has a fundamental resonant frequency of radial mode of vibration at 455 kHz. The ring resonator 10 is free of unwanted responses in the frequency range of 500 kHz. to 2,000 kHz.

Figure 1:
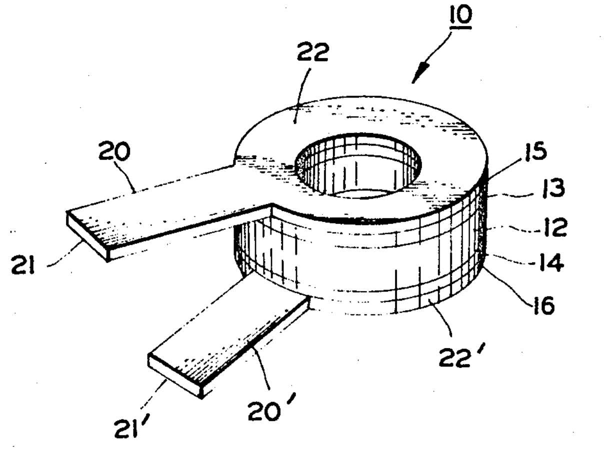
FIG. 1 is a perspective view of a piezoelectric ceramic ring resonator according to the present invention.

It has been discovered in accordance with the present invention that the piezoelectric ceramic resonator shown in FIG. 1 has frequency-admittance characteristics free from unwanted responses in a wide frequency range. The frequency range in which unwanted responses do not appear can be controlled by changing the inside diameter/outside diameter ratio of the ring in accordance with the present invention.

It is necessary that the inside diameter/outside diameter ratio be higher than 0.45 in order to provide a frequency range wider than about 2 mHz. The upper limit of the diameter ratio depends upon the electromechanical coupling coefficient of the material used for ceramic thin ring. A higher diameter ratio results in a piezoelectric ceramic thin ring having a high resonant resistance and a low mechanical Q. In addition, the static capacitance of the piezoelectric ceramic thin ring decreases with an increase in the diameter ratio. The effective electromechanical coupling coefficient of the ceramic thin ring resonator also decreases with an increase in the diameter ratio. As a result, an IF filter employing a piezoelectric ceramic thin ring is provided with an excessive input impedance and a narrow bandwidth. Such an IF filter is not desirable, particularly in an IF amplifier circuit for AM radio receivers.

It has been discovered according to the present invention that a diameter ratio of 0.45 to 0.60 results in a superior piezoelectric ceramic resonator adapted 0.60 a 455 kHz. IF filter when the ceramic thin ring has an electromechanical coupling coefficient of 0.35 to 0.40.

Figure 2:
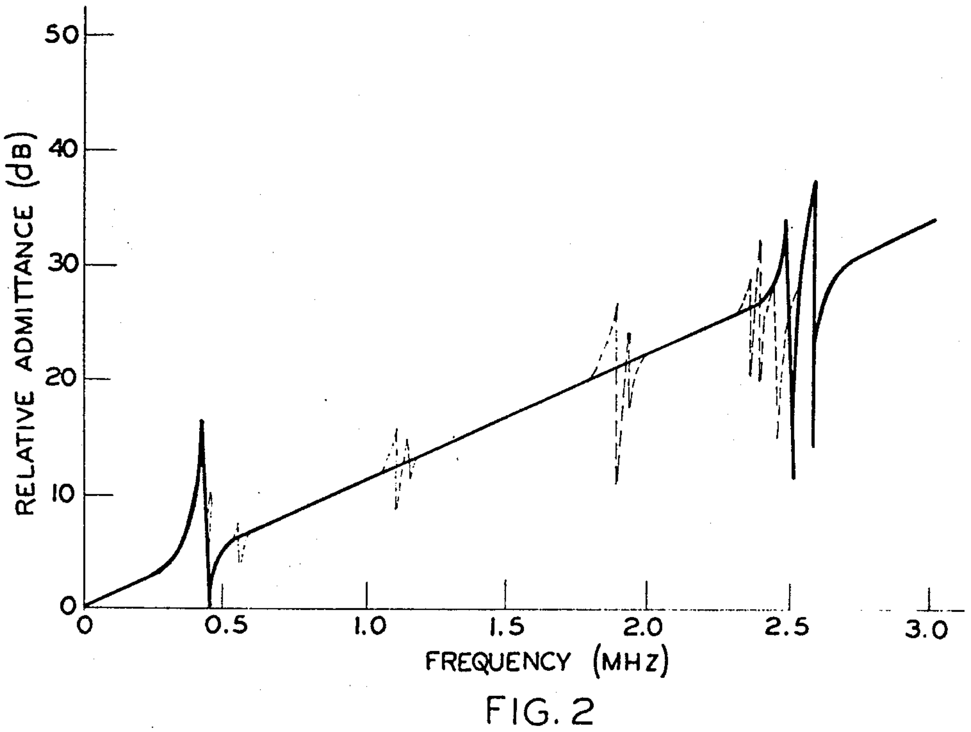
FIG. 2 is a graph showing frequency characteristics of electric admittances of the piezoelectric ceramic ring resonator shown in FIG. 1 compared with a conventional piezoelectric ceramic resonator.

Thick conductive plates 20 and 20' cause the resultant resonator to have a low mechanical Q and to produce a weak vibration at a low amplitude. In addition, when the width of the lead stem 21 is great, more unwanted responses are produced, as indicated by the dotted curve in FIG. 2.

It has been found that if each of the conductive plates 20 and 20' has a thickness less than 5 percent of the thickness of the ceramic ring 12, and that if each of the lead stems 21 and 21' has a width smaller than about three-tenths of the outside diameter of the ceramic thin ring 12, then optimum performance as a piezoelectric ceramic thin ring resonator according to the invention is achieved.

Figures 3A, 3B:
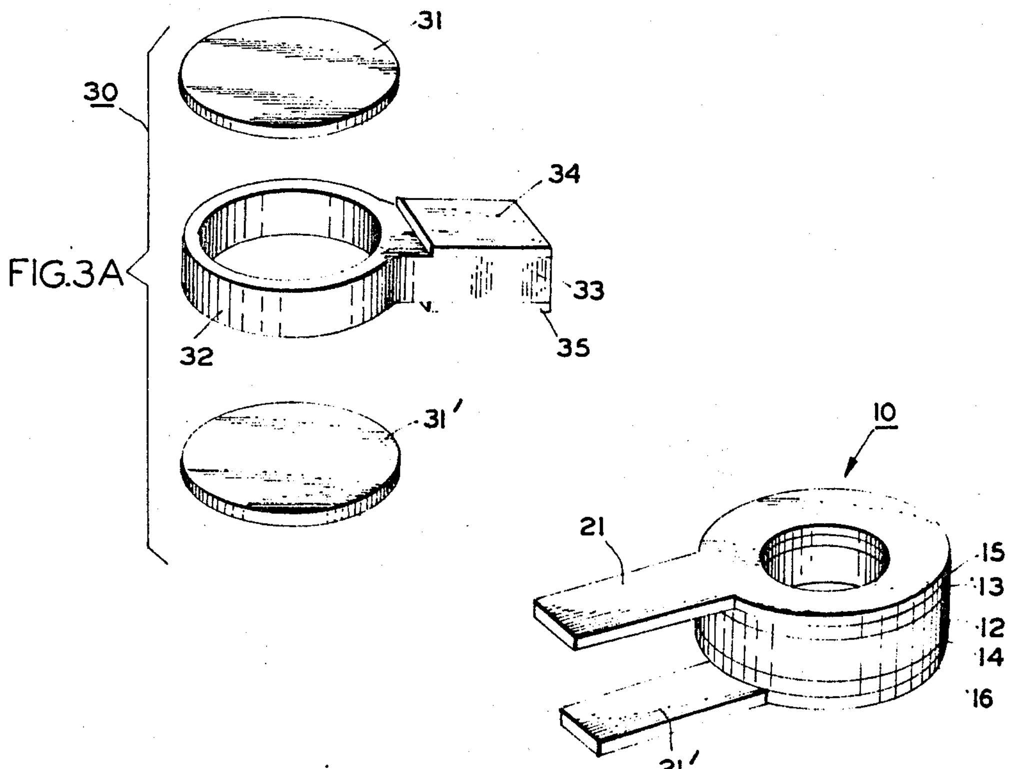
FIG. 3*a* is a perspective view of a housing according to the present invention.
FIG. 3*b* is a perspective view of a modified piezoelectric ceramic ring resonator according to the present invention.

A piezoelectric ceramic thin ring resonator can be easily mounted in a small housing in accordance with the present invention. Referring to FIG. 3*a*, a housing 30 according to the present invention consists essentially of three parts, i.e. two covers 31 and 31' and ring shaped frame 32 having a projection 33 with two flat surfaces thereon. Two lead terminals 34 and 35 are adhered to the flat surfaces, respectively. The housing 30 is made of any suitable insulating material such as epoxy resin, glass or ceramic.

Figure 3C:
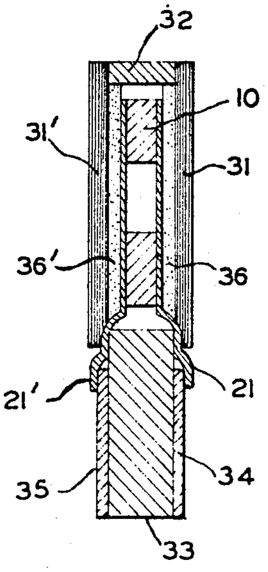
FIG. 3*c* is a sectional view of a mounting and housing of a piezoelectric ceramic ring resonator according to the present invention.

A piezoelectric ceramic resonator according to the present invention may have two stems faced to each other, as shown in FIG. 3*b*, wherein similar reference characters designate elements similar to those of FIG. 1. The stems 21 and 21' are adapted to pinch firmly the projection 33 of the housing 30 and contact the lead terminals 34 and 35, as shown in FIG. 3*c*. After insertion of the piezoelectric ceramic ring resonator 10 into the ring shaped frame 32, covers 31 and 31' are secured to the ring-shaped frame 32. Spongelike disc spacers 36 and 36' are inserted between the ceramic ring resonator 10 and covers 31 and 31—' to support the resonator from shock and external vibration.

A piezoelectric ceramic ring resonator according to the present invention is made by employing a piezoelectric ceramic material, for example, the piezoelectric ceramic material described in U.S. Pat. No. 3,268,453 in the form of a thin ceramic ring having dimensions as listed in table 1.

TABLE 1

| Sample No. | 1 | 2 | 3 | 4 | 5 | 6 | 7 |
|---|---|---|---|---|---|---|---|
| Outside diameter, mm | 3.41 | 3.54 | 3.43 | 3.40 | 3.67 | 3.10 | 5.50 |
| Inside diameter, mm | 1.86 | 1.78 | 1.70 | 1.72 | 1.70 | 1.86 | 0 |
| Thickness | 0.52 | 0.41 | 0.32 | 0.26 | 0.32 | 0.32 | 0.32 |

Remark: Sample No. 7 is a disc resonator with the same resonant frequency.

where the inside diameter/outside diameter ratios of No. 1 to No. 4 are about 0.5. The diameter ratios of No. 5 and No. 6 are about 0.45 and 0.6, respectively.

The piezoelectric ceramic material has piezoelectric characteristics as listed in table 2.

TABLE 2

| | |
|---|---|
| frequency constant | 2,400 kHz.-mm. |
| frequency stability | |
| with time | 0.05%/decade |
| with temperature | $30\times10^{-6}$/C. |
| dielectric constant | 1,350 |
| electromechanical coupling coefficient | 0.36 |
| mechanical Q | 1,300 |

Remark: radial vibration mode of a disc

In a specific embodiment of the piezoelectric ceramic ring resonator according to the present invention, the ceramic ring resonator is characterized by being free from unwanted responses in the wide frequency range of 500 kHz. to about 2 mHz., by having a suitable band width for a 455 kHz. IF ceramic filter for radio receivers and by being of small size as listed in table 3.

TABLE 3

| Sample No. | 1 | 2 | 3 | 4 | 5 | 6 | 7 |
|---|---|---|---|---|---|---|---|
| Resonant frequency, kHz | 455 | 457 | 457 | 460 | 446 | 455 | 455 |
| Band-width, kHz | 11.3 | 11.6 | 11.0 | 12.0 | 12.2 | 10.2 | 25.3 |
| Resonant resistance, ohms | 59 | 44 | 28 | 31 | 47 | 57 | 5 |
| Capacitance, pf | 180 | 230 | 290 | 360 | 330 | 220 | 430 |
| Lowest unwanted response, mHz | 2.51 | 2.27 | 2.26 | 2.31 | 1.99 | 2.70 | 1.12 |

Remark: Sample No. 7 is a disc resonator with the same resonant frequency.

While there have been described what are at present considered to be the preferred embodiments of the invention, it will be obvious to those skilled in the art that various changes and modifications may be made therein without departing from the invention, and it is aimed, therefore, to include all such changes and modifications as fall within the true spirit and scope of the invention.

What is claimed is:

1. A piezoelectric ceramic resonator adapted for an IF filter comprising: a piezoelectric ceramic thin ring having two electrodes applied to opposed major surfaces thereof, said ceramic ring being in a fundamental resonance of radial vibration mode and having an inside diameter/outside diameter ratio of 0.45 to 0.60; two conductive plates consisting essentially of a lead stem and a conductive ring which has the same dimensions in the inside and outside diameters as said piezoelectric ceramic ring, each of said conductive plates having a thickness less than 5 percent of the thickness of said ceramic ring and each of said lead stems having a width less than three-tenths of the outside diameter of said ceramic ring and being secured to said major surfaces of said ceramic ring; and means for holding said ceramic ring in a housing having a projection with two opposed flat surfaces whereby said lead stems are secured to lead terminals formed on said two opposed flat surfaces, and said housing including spongelike disk spacers which cover said opposed major surfaces of said ceramic ring together with said two conductive plates.